United States Patent [19]

Billings

[11] Patent Number: 4,970,420

[45] Date of Patent: Nov. 13, 1990

[54] POWER FIELD EFFECT TRANSISTOR DRIVE CIRCUIT

[75] Inventor: William W. Billings, American Township, Allen County, Ohio

[73] Assignee: Westinghouse Electric Corp., Pittsburgh, Pa.

[21] Appl. No.: 379,314

[22] Filed: Jul. 13, 1989

[51] Int. Cl.$^5$ .................. H03K 17/687; H03K 3/01
[52] U.S. Cl. .................. 307/571; 307/270; 307/246
[58] Field of Search ............ 307/570, 571, 572, 573, 307/581, 270, 282, 246

[56] References Cited

U.S. PATENT DOCUMENTS

| | | | |
|---|---|---|---|
| 4,346,375 | 8/1982 | Billings | 307/350 |
| 4,404,473 | 9/1983 | Fox | 307/125 |
| 4,408,131 | 10/1983 | Fox | 307/311 |
| 4,438,356 | 3/1984 | Fleischer | 307/571 |
| 4,461,966 | 7/1984 | Hebenstreit | 307/571 |
| 4,492,883 | 1/1985 | Janutka | 307/581 |
| 4,656,365 | 4/1987 | Billings | 307/140 |
| 4,748,351 | 5/1988 | Barzegar | 307/571 |
| 4,767,952 | 8/1988 | Nollet | 307/270 |

*Primary Examiner*—Timothy P. Callahan
*Attorney, Agent, or Firm*—R. P. Lenart

[57] ABSTRACT

A switching circuit is provided with a power field effect transistor having a drain terminal, a source terminal and a gate terminal. A gate resistor is connected to the gate terminal. In response to a turn-on signal, a DC gate voltage is produced between the gate resistor and the source terminal. A circuit branch having a normally-on solid state switching device is connected between the gate resistor and the source terminal. The normally-on solid state switching device is turned off in response to the turn-on signal, and enabled in the absence of the turn-on signal to improve the turnoff characteristics of the power field effect transistor.

3 Claims, 2 Drawing Sheets

POWER FIELD EFFECT TRANSISTOR DRIVE CIRCUIT

BACKGROUND OF THE INVENTION

This invention relates to solid state switching circuits and, more particularly, to such circuits which employ a power field effect transistor as the solid state switching element.

Advances in the technology of power field effect transistors (PFET) which have increased voltage capabilities to greater than 1Kv and current ratings in the hundreds of amperes, have made the use of PFETs advantageous in solid state relays and power controllers. With the low power drive requirements of PFETs, it is theoretically possible to control kilowatts of load power with microwatts or milliwatts of gate power. However, the minimum amount of gate drive power that can be realized is constrained by the PFET gate input characteristic that is highly resistive for DC or steady-state conditions but highly capacitive for AC or dynamic conditions. When a PFET is used in a power controller, a load is energized by applying a gate signal to the PFET and de-energized by removing the gate signal. The input resistance of the PFET gate circuit is on the order of megohms or more and has a negligible effect on the dynamic operation of the PFET. However, the input capacitance, which may be 1,000 pfds or greater, must be considered. Consequently, the gate voltage, $V_g$, response to drive signal changes is determined by the following expression:

$$V_g = V_d (1 - e^{-t/R_{eq} \cdot C_{eq}})$$

where $V_d$ is the drive voltage, $R_{eq}$ is determined by the control circuit resistances, and $C_{eq}$ is determined by the control circuit and the PFET gate circuit capacitances. From this expression, it can be seen that the gate voltage change to drive signal step changes will be exponential voltage rises and decays at rates determined by the circuit resistance and capacitance values that consequently affect PFET time delay and switching rate responses.

In a basic PFET gate drive circuit, a drive voltage is applied to a gate resistor that is connected in series with the PFET gate terminal. The gate and drive circuit time constant will be the same for both turn-on and turn-off. If it is desired to speed up the turn-off time without changing the turn-on time, then the gate resistor can be bypassed with a reverse bias diode and discharge resistor to decrease the turn-off time.

In some applications, particularly high voltage DC and multiple pole power switch applications, it is desirable to provide isolated gate drive control signals. Cost and reliability considerations dictate that the drive circuit be as simple as possible.

For power controller applications, it is desirable to provide a soft turn-on and turn-off or di/dt load current control in order to minimize electromagnetic interference and ringing and to help limit fault currents. However, these controlled, slower switching times also increase the dissipation in the PFET which must be kept within its safe operating area capability to prevent a catastrophic failure.

It is therefore desirable to devise a power field effect transistor drive circuit that provides independent control of turn-on and turn-off switching speeds, while operating at low power for high efficiency and to enable the use of integrated circuit logic devices for providing the gate drive voltage.

SUMMARY OF THE INVENTION

Switching circuits constructed in accordance with the present invention include a power field effect transistor having a drain terminal, a source terminal, and a gate terminal, with a gate resistor connected to the gate terminal. A DC gate drive voltage is applied between the gate resistor and the source terminal in response to a turn-on signal. A circuit branch, including a normally-on solid state switching device is connected between the gate resistor and the source terminal, and a circuit is provided to turn-off the solid state switching device in response to the turn-on signal.

The switching circuits of this invention provide independent control of the turn-on and turn-off switching speeds of a power field effect transistor while utilizing a low power drive circuit.

BRIEF DESCRIPTION OF THE DRAWINGS

The invention will become more readily apparent from the following description of the preferred embodiments thereof, shown by way of example only, in the accompanying drawings wherein.

DESCRIPTION OF THE PREFERRED EMBODIMENTS

Figure 1:
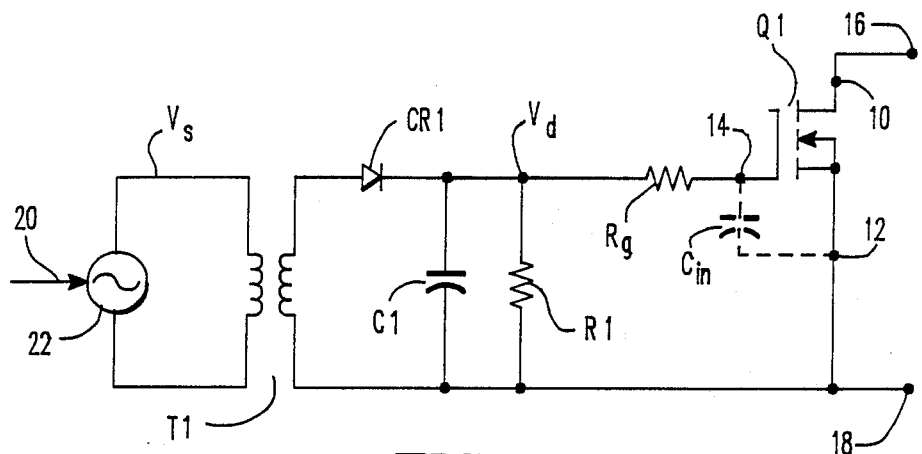
FIG. 1 is a schematic diagram of a prior art power field effect transistor switching circuit.

The present invention can be readily understood by referring first to the prior art power field effect transistor switching circuit of FIG. 1. A power field effect transistor Q1 having drain, source and gate terminals 10, 12 and 14 respectively, is connected to a pair of load terminals 16 and 18 as shown. A control signal on line 20 causes a signal generator 22 to produce a turn-on signal that is transmitted through an isolation transformer T1, rectified by diode CR1 and filtered by capacitor C1 to produce a drive voltage $V_d$ across resistor R1. $C_{in}$ represents the internal capacitance of the power field effect transistor Q1.

The circuit of FIG. 1 uses a transformed AC gate drive signal to provide total gate drive signal power and does not require an isolated gate drive power supply at the PFET gate-to-source operating potential. When transformer T1 is energized by the signal source 22, the secondary voltage is rectified and filtered by CR1 and C1 and the resulting voltage, $V_d$, is applied to the PFET gate by way of gate resistor $R_g$. At turn-on, the gate voltage increases at a rate determined by $V_d$, $R_g$, C1 and $C_{in}$, considering the source impedance of the transformer to be negligible. At turn-off, the removal of the drive signal $V_s$, results in a gate voltage decay rate determined by $V_d$, R1, $R_g$, C1 and $C_{in}$. By comparing the parameters which determine the rise and fall times of the gate voltage, it can be seen that the turn-off time is increased by the value of R1.

While the turn-on times may be effectively controlled for a given power field effect transistor by selecting the values of $V_d$, C1 and $R_g$, conventional means of controlling the turn-off time fail for the following reasons:

1. The series resistor, $R_g$, serves to provide parasitic suppression and to preclude high frequency ringing of the PFET during load switching and therefore care must be taken in bypassing it with the diode for turn-off speed up. Also, the value of $R_g$ is considerably less than the value of R1 so that bypassing $R_g$ will provide limited turn-off time improvement; and 2. Decreasing the value of R1 results in an undesirable increase in the on-state power dissipation since the voltage $V_d$ is continuously impressed across the resistor R1.

Figure 2:
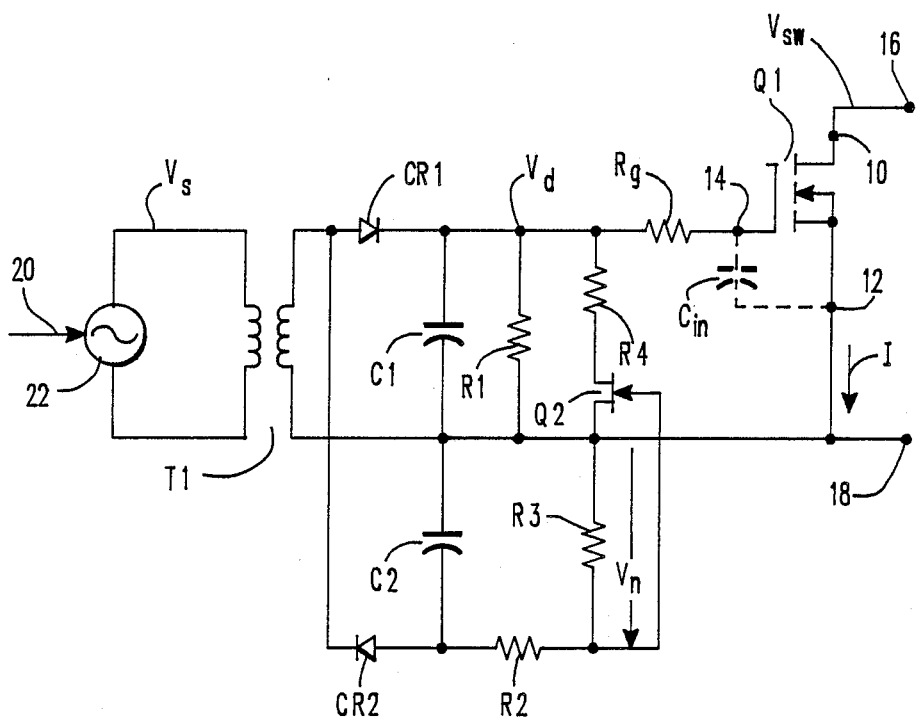
FIGS. 2 and 3 are schematic diagrams of alternative embodiments of the switching circuit of the present invention.

In order to improve the operational characteristics of the circuit, the circuit was modified as illustrated in the schematic diagram of the preferred embodiment of the invention illustrated in FIG. 2. A negative control voltage, $V_n$, (complimentary to $V_d$) is developed and filtered by diode CR2 and capacitor C2. A resistive voltage divider, comprising the series connection of resistors R2 and R3, applies a portion of this negative voltage to the gate of a normally-on, junction field effect transistor (JFET) Q2. This negative voltage is used to cut off the normally conducting Q2 when the gate drive signal is supplied. The response time of this cut off circuit is designed to be at most one-tenth of the response time of the positive gate drive circuit by selecting the component values such that:

$$(R2+R3) \cdot C2 << R1 \cdot (C1+C_{in})$$

Consequently, JFET Q2 shuts off quickly at turn-on and conducts quickly at turn-off. This results in resistor R4 having a negligible effect at turn-on but rapidly clamping the gate drive signal at turn-off. It also allows resistor R1 to be increased to a considerably higher value to decrease the drive circuit on-state power dissipation. In one drive circuit developed in accordance with this invention, this power dissipation reduction was from 225 milliwatts to 10 milliwatts over a 20 fold decrease. For applications of this invention wherein the on resistance of Q2 is of sufficient magnitude, R4 may be zero.

Figure 3:
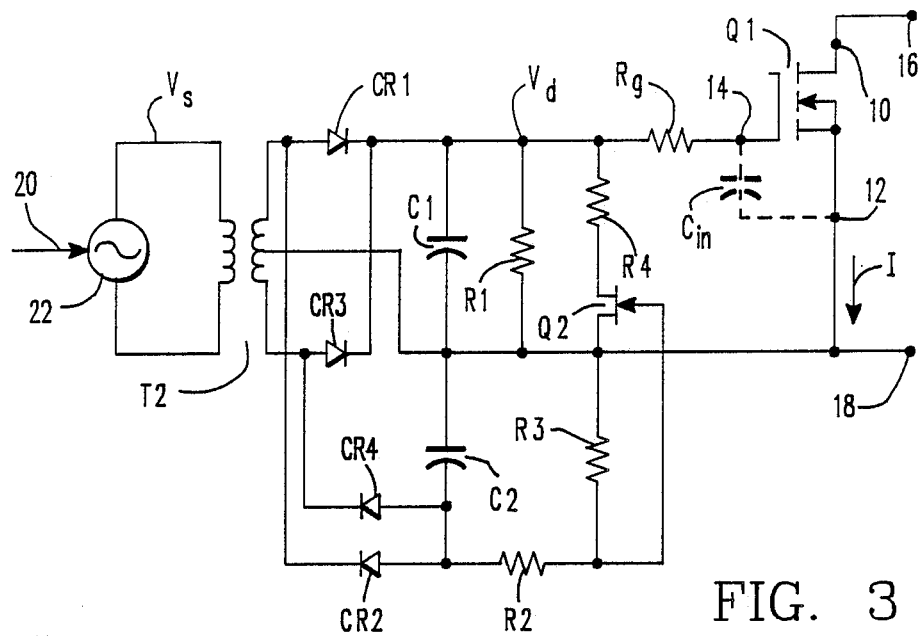

FIG. 3 is a schematic diagram of an alternative embodiment of the present invention which incorporates full wave rectification of the turn-on signal $V_s$. This is accomplished by replacing transformer T1 with a center tapped transformer T2 and adding diodes CR3 and CR4 connected as illustrated in FIG. 3. Tests conducted on circuits constructed in accordance with this invention show that the turn-on switching time is more dependent upon the series gate resistor, $R_g$, than on the shunt resistor, R1. The turn-off switching time can be effectively controlled by controlling the value of R4. Without R4 in the circuit, the turn-off times are excessively slow and will cause excessive stress on the PFET.

Figure 4:
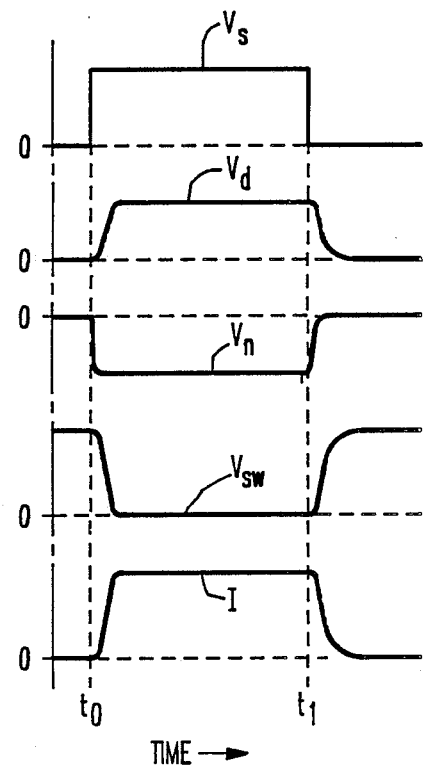
FIG. 4 is a series of waveforms which illustrate the operation of the circuits of FIGS. 2 and 3.

The operation of the circuits of this invention is illustrated by the waveforms of FIG. 4. At time $t_0$, the turn-on signal $V_s$ changes to a logic high state to initiate turn-on of the PFET. At time $t_1$, the turn-on signal $V_s$ reverts to a logic O. $V_{sw}$ is the switch voltage appearing between the drain and source terminals of the power field effect transistor, while I represents the current through it. Note that the rise and fall times of the negative voltage $V_n$ are significantly shorter than those for the drive voltage $V_d$.

The preferred embodiments of the present invention provide isolated gate drive signals without requiring separate isolated power supplies, provide independent control of turn-on and turn-off PFET switching times, require low power consumption such that they may be driven by logic integrated circuits if desired, and are compatible with a wide variety of PFETs. For applications where drive isolation is not required, the isolation transformers in FIGS. 2 and 3 may be eliminated with the turn-on signal being applied directly to the anode of diode CR1.

Although the present invention has been described in terms of what are at present believed to be its preferred embodiments, it will be apparent to those skilled in the art that various changes may be made without departing from the scope of the invention. It is therefore intended that the appended claims cover such changes.

What is claimed is:

1. A switching circuit comprising:
   a power field effect transistor having a drain terminal, a source terminal and a gate terminal;
   a gate resistor connected to said gate terminal;
   means for producing a DC gate drive voltage between said gate resistor and said source terminal in response to a turn-on signal;
   a circuit branch electrically connected between said gate resistor and said source terminal;
   said circuit branch including a normally-on solid state switching device; and
   means for turning off said solid state switching device in response to said turn-on signal;
   wherein said means for producing a DC gate drive voltage includes a transformer having a primary winding for receiving said turn-on signal and having a secondary winding, a circuit branch connected across said secondary winding, said circuit branch comprising a diode and a capacitor electrically connected in series with each other, and a second resistor electrically connected in parallel with said capacitor.

2. A switching circuit as recited in claim 1, wherein said circuit branch further comprises:
   a discharge resistor electrically connected in series with said normally-on solid state switching device.

3. A switching circuit as recited in claim 1, wherein said normally-on solid state switching device is a junction field effect transistor having a gate terminal, and wherein said means for turning off said solid state switching device comprises:
   a second circuit branch connected across said secondary winding, said second circuit branch comprising a second diode and a second capacitor electrically connected in series with each other; and
   a resistive voltage divider electrically connected in parallel with said second capacitor, said resistive voltage divider comprising third and fourth resistors electrically connected in series with each other, with a junction point between said third and fourth resistors being connected to the gate terminal of said junction field effect transistor.

* * * * *